(12) United States Patent
Haigh et al.

(10) Patent No.: US 6,836,671 B2
(45) Date of Patent: Dec. 28, 2004

(54) AMPLIFIER CIRCUITRY

(75) Inventors: John Anthony Haigh, Yateley (GB); John Small, New Malden (GB); Manook Soghomonian, Luton (GB)

(73) Assignee: Nokia Corporation, Espoo (FI)

( * ) Notice: Subject to any disclaimer, the term of this patent is extended or adjusted under 35 U.S.C. 154(b) by 492 days.

(21) Appl. No.: 09/739,030

(22) Filed: Dec. 13, 2000

(65) Prior Publication Data

US 2002/0125948 A1 Sep. 12, 2002

(Under 37 CFR 1.47)

Related U.S. Application Data

(63) Continuation of application No. PCT/EP99/04536, filed on Jul. 1, 1999.

(30) Foreign Application Priority Data

Jul. 2, 1998 (GB) .............................................. 9814400

(51) Int. Cl.[7] ................................................ H04Q 7/20
(52) U.S. Cl. .................. 455/561; 455/114.2; 455/114.3
(58) Field of Search ............................ 455/561, 114.1, 455/114.2, 114.3, 115.2, 91, 24, 63.1, 126, 127.4, 144, 194.2; 375/294, 295, 296, 297; 330/151, 149, 84, 85

(56) References Cited

U.S. PATENT DOCUMENTS 5,077,532 A    12/1991   Obermann et al.

FOREIGN PATENT DOCUMENTS

| EP | 04328875 A2 | 7/1991 |
|---|---|---|
| EP | 0720284 A1 | 7/1996 |
| GB | 2254505 A | 7/1992 |
| GB | 2273622 A | 6/1994 |
| WO | WO 94/17587 | 8/1994 |

*Primary Examiner*—Jean Gelin
(74) *Attorney, Agent, or Firm*—Squire, Sanders & & Dempsey L.L.P.

(57) ABSTRACT

A feed-forward amplification circuit, for producing compensated output signals, comprises an amplifier arranged to receive a plurality of input signals including a control signal, within a predetermined frequency range, and to produce a plurality of amplified signals including said control signal, within said predetermined frequency range, wherein said predetermined frequency range lies within the operational range of the amplifier. Phase shift means are arranged to receive said input signals and said amplified signals and to introduce a relative phase shift between said input signals and said amplified signals to produce an error signal. Combination means for combining said error signal with said amplified signals to produce said compensated output signal; and control means for controlling said phase shift means in dependence on the relative phase difference between the control signal in said input signals and the control signal in said amplified signals.

37 Claims, 4 Drawing Sheets

AMPLIFIER CIRCUITRY

This is a continuation of Application No. PCT/EP99/04536, filed Jul. 1, 1999.

FIELD OF THE INVENTION

The present invention relates to feed-forward amplification circuitry and a method of providing feed-forward amplification. The invention finds application in cellular radio networks and, in particular, but not exclusively, those operating in accordance with the GSM standard.

BACKGROUND OF THE RELATED ART

In a cellular radio network each of a plurality of base transceiver stations serves a particular geographic area (a cell). When a transceiver terminal such as a mobile phone is in one of these areas it is served by the base station associated with that area. The base stations are designed to serve one or more transceiver terminals simultaneously. The base stations typically communicate with the transceiver terminals by transmitting signals within a predetermined transmission radio frequency band. Each of the base stations has amplification circuitry for amplifying signals before transmission to a transceiver terminal.

All amplifier circuits suffer from distortion. The level of distortion is dependent upon the design of the circuit and the conditions under which the circuit operates. In the case of a high power amplifier such as those typically used in base stations, intermodulation distortion (IMD) is the most significant form of distortion. Intermodulation distortion generates intermodulation product signals (INTERMOD) at frequencies which are a mixing function of the signals supplied to the amplifier. The most significant INTERMODs are the third order products. As an example, a signal for transmission may comprise two component signals at frequencies F1 and F2 which are to be transmitted. The amplifier will have an operational range which includes both F1 and F2. The third order INTERMODs are generated by the mixing of the two frequencies by the amplifier and will be generated at frequencies 2F1–F2 and 2F2–F1. These third order products will typically fall within the operational range of the amplifier and also within the transmission frequency band of the base station. These INTERMODs consequently form a source of noise in the transmitted signal.

The effect of INTERMODs can be reduced by making the amplifier operate in a more linear fashion. Amplifier linearity can be enhanced by using feed-forward compensation. FIG. 1 illustrates a feed-forward amplifier circuit 1. The feed-forward amplifier circuit 1 receives an input signal 11 at a radio frequency and produces a compensated amplified signal 37 at a radio frequency. The feed-forward amplifier circuitry 1 contains a first hybrid 12, a first phase trimmer 14, delay circuitry 18, a radio frequency power amplifier 20, a directional coupler 22 functioning as a detector, a variable attenuator 24, a second hybrid 26, a second variable attenuator 28, a second phase trimmer 30, an amplifier 32, second delay circuitry 34 and a second directional coupler 36 functioning as a combiner.

The input signal 11 is supplied to the first hybrid 12. This 3 dB hybrid splits signal 11 into two paths. The first path supplies part of the input signal 11 as an input to the power amplifier 20. The second path supplies a hybrid output signal 13 which is a proportion of the input signals 11 as an input to the first phase trimmer 14. The hybrid output signal 13 has a phase difference with respect to the input signal 11 equivalent to +90°. The first phase trimmer 14 introduces a phase shift to its input signal, the hybrid output signal 13, to produce a phase compensated signal 17. The phase shift introduced by the first phase trimmer 14 may vary between 0–360°. The first phase trimmer 14 receives as a controlling input a first phase control signal 15. The first phase control signal 15 controls the value of the phase shift introduced to the hybrid output signal 13. The phase compensated signal 17 passes through delay circuitry 18 to produce the delayed phase compensated signal 19 which is supplied as a first input to the second-hybrid 26.

The power amplifier 20 which receives input signal 11 from the first hybrid 12 produces amplified signal 21. The amplified signal 21 passes through the first directional coupler 22, and second delay circuitry 34 to produce a delayed amplified signal 35. The directional coupler 22 detects the amplified signal 21 and produces a detected amplified signal 23 which is supplied as an input to the first variable attenuator 24. The variable attenuator 24 reduces the power of the detected amplified signal 23 to produce the attenuated detected signal 39 which is supplied as a second input to the second hybrid 26. The value of attenuation effected by the variable attenuator 24 is controlled by a first attenuation control signal 25 supplied to the variable attenuator 24. The attenuator 24 ensures that the two signals 19 and 39 input to the second hybrid 26 are of a similar magnitude. The second hybrid 26 introduces a phase shift equivalent to +90 ° into the delayed phase compensated signal 19 and combines this signal with the attenuated detected signal 39 to produce their vector sum, the error signal 27.

Referring to FIG. 2a an illustrated example of a frequency spectrum for one type of exemplary input signal 11 is illustrated. According to this example the input signal 11 has two frequency components having frequencies F1 and F2. FIG. 2b illustrates the amplified signal 21 which may be formed when the input signal 11 illustrated in FIG. 2a is passed through the power amplifier 20. It can be seen that the amplified signal 21 has third order INTERMODs 21a and 21b at respectively frequencies 2F1–F2 and 2F2–F1. These INTERMODs will typically lie within the band of frequencies at which the transmitter containing the amplifying circuit is designed to transmit. The circuitry described in FIG. 1 isolates the additional frequency component which has been introduced to the input signal 11 by the amplifier 20 as the error signal 27. The error signal 27 therefore has a frequency spectrum which is essentially the subtraction of the frequency spectrum of the input signal 11 illustrated in FIG. 2a from the frequency spectrum of the amplified signal 21 illustrated in FIG. 2b. The frequency spectrum of the error signal 27 therefore has a form similar to that illustrated in FIG. 2c. It will therefore be appreciated that the error signal is created by taking samples of the input signal 11 and the amplified signal 21 and adjusting their relative phase and amplitude relationships to obtain cancellation of the undistorted components in the amplified signal 21 to leave remaining the distorted components of the amplified signal 21 as the error signal 27. The first and second hybrids 12 and 26 introduce a phase shift equivalent to 180°. The phase trimmer 14 and delay circuitry 18 introduce a further, variable, phase shift which compensates for the different delays experienced between the signal being input at the first hybrid and received at the first input of the second hybrid and a signal being input at the input of the first hybrid and being received at the second input of the second hybrid.

Referring back to FIG. 1, the error signal 27 has its power modified by the second variable attenuator 28. The phase of the error signal 27 is then varied relative to the amplified signal 21 by the second phase trimmer 30. The error signal is then buffered by the amplifier 32 to produce a compensated error signal 33. The second variable attenuator 28 receives at a control input a second attenuation control signal 29 which controls the power level of the compensated error signal 33. The second phase trimmer 30 receives at a control input a second phase control signal 31 which controls the phase of the compensated error signal 33 relative to the delayed amplified signal 35 produced by the second delay circuitry 34. The compensated error signal 33 is supplied as an input to the second directional coupler 36 acting as a combiner. The combiner 36 also receives the delayed amplified signal 35. The combiner couples the compensated error signal 33 to the delayed amplified signal 35 to produce the compensated amplified signal 37 which is output from the feed-forward application circuitry 1.

The purpose of the second delay circuitry 34, the second variable attenuator 29, the second phase trimmer 31 and the second amplifier 32 is to ensure that the compensated error signal 33 and the delayed amplified signal 35 are correlated in time and amplitude so that at any one moment the compensated error signal 33 at the combiner 36 is representative of the signal distortion contained within the delayed amplified signal 35 at the combiner 36. The combiner 36 combines the compensated error signal 33 and the delayed amplified signal 35 to substantially remove such distortion from the delayed amplified signal 35 to produce the compensated amplified signal 37.

Referring to FIG. 2c, an illustrative frequency spectrum of the compensated error signal 33 produced from input signal 11 and amplified signal 21 having frequency spectrums illustrated in FIGS. 2a and 2b is shown. FIG. 2d illustrates the frequency spectrum of the compensated amplified signal 37 produced when the compensated error signal 33 illustrated in FIG. 2c is combined with the delayed amplified signal 35 derived from the amplified signal 21 illustrated in FIG. 2b.

For the feed-forward amplification circuitry 1 to operate correctly the path of the cancellation loop through first hybrid 12, first trimmer 14, delay circuitry 18 and second hybrid 26 must have the same electrical length, except for a 180° phase shift to cause cancellation, as the second path of the cancellation loop via the first hybrid 12, power amplifier 20, detector 22, first variable attenuator 24 and second hybrid 26. Changes to the electrical length of any component in either the first path or the second path will disturb this condition and prevent cancellation. Consequently, changes to the electrical length of any component in either path should be compensated for. Such compensation is effected by the first phase control signal 15.

FIG. 3a illustrates a first phase control circuit 2 for providing the first phase control signal 15. The phase control circuit has a directional coupler 40 functioning as a second detector, a directional coupler 42 functioning as a third detector, a mixer 44, a phase locked loop (PLL) 46. The second detector 40 samples the delayed phase compensated signal 19 to produce a second detected signal 41 which is input to the mixer 44. The third detector 42 samples the attenuated detected signal 39 and produces the third detected signal 43 which is supplied as an input to the mixer 44. The mixer 44 multiples the second detected signal 41 with the third detected signal 43 to produce a mixed signal 45 which is supplied as an input to the phase locked loop 46. The phase locked loop 46, produces the first phase control signal 15. The first phase control signal 15 has a value dependent upon the phase difference between the delayed phase compensated signal 19 and the attenuated detected signal 39. This signal varies the first phase trimmer 14 which in turn varies the phase compensated signal 17 and the delayed phase compensated signal 19. A feedback loop including the phase locked loop is therefore established which operates to vary the phase relationship between the delayed phase compensation signal 19 and the attenuated detected signal 39 such that the first and second paths in the cancellation loop have the same electrical length.

A major problem with the first phase control circuit 2 is that phase locked loops do not work well if the mixed signal 45 is multi-frequency. The conditions for a lock of the phase locked loop are less stable for a multi-frequency input signal.

FIG. 3b illustrates a second phase control circuit 4 which is adapted to overcome this problem. According to this solution a pilot tone is introduced into the input signal 11. This pilot tone is outside the transmission frequency band at which a transmitter comprising the amplifier circuit 1 would transmit signals. The purpose of the pilot tone is solely to allow the phase locked loop 46 a signal on which to lock onto. The pilot tone is therefore introduced into the input signal 11 and later removed from the compensated amplified signal 37 by a narrow band filter. Typically a notch filter is used for this purpose where the notch filter is specifically designed to remove the pilot tone. The second phase control circuit 4 is similar to the first phase control circuit 2 but additionally has a first narrow band filter 48 for filtering the second detected signal 41 and producing a first narrow band detected signal 49 which is a signal having a narrow frequency band centred around the frequency of the pilot tone. The circuit also has a second narrow band pass filter 50 which filters the third detected signal 43 and produces a second narrow band detected signal 51 which has a narrow band of frequency centred around the frequency of the pilot tone. The mixer 44 combines the first narrow band detected signal 49 and the second narrow band detected signal 51 to produce a mixed signal 45 which has a narrow frequency band centred around the pilot tone. This signal is used by the phase locked loop to produce the first phase control signal 15. The circuit of FIG. 3b otherwise operates in the same manner as the first phase control circuit 2 in FIG. 3a. The disadvantages of the second phase control circuit 4 are that the pilot tone is outside the frequency band of the amplifier and also outside the transmission band of a receiver containing the application circuitry. There is consequently no guarantee that the effect of the power amplifier 20 on the pilot tone is equivalent to that on the input signal 11 which will eventually be transmitted after amplification. The pilot tone is also a large unwanted signal requiring additional components to perform heavy filtering to remove the signal from the compensated amplified signal 37. In addition a synthesiser will need to be included to provide a pilot tone at the input to the first hybrid 12. Such a synthesiser has volume, mass and power requirements and has to be shielded from the rest of the amplifier otherwise there may be cross interference. An amplification circuit using the second phase control circuit 4 to supply the first phase control signal 15 therefore suffers many problems.

SUMMARY OF THE INVENTION

It is an aim of embodiments of the present invention to provide an improved feed-forward amplification circuit.

According to one aspect of the present invention there is provided a feed-forward amplification circuit, for producing compensated output signals, comprising: an amplifier arranged to receive a plurality of input signals including a control signal, within a predetermined frequency range, and to produce a plurality of amplified signals including said control signal, within said predetermined frequency range, wherein said predetermined frequency range lies within the operational range of the amplifier; phase shift means arranged to receive said input signals and said amplified signals and to introduce a relative phase shift between said input signals and said amplified signals to produce an error signal; combination means for combining said error signal with said amplified signals to produce said compensated output signal; and control means for controlling said phase shift means in dependence on the relative phase difference between the control signal in said input signals and the control signal in said amplified signals.

In contrast to the arrangement described in relation to FIG. 3b, the frequency of the control signal lies in the operational range of the amplifier. The pilot tone of FIG. 3b does not lie within the operational range of the amplifier. This means that better compensation for errors can be achieved in embodiments of the present invention as compared to the arrangement of FIG. 3b. Additionally, in embodiments of the present invention, the control signal preferably is utilised for other reasons and not simply to act as pilot signal.

Preferably, said control means comprises a first selective detection means being selective to a predetermined frequency for detecting the control signal in said input signals, and a second selective detection means being selective to said predetermined frequency, for detecting the control signal in said amplified signals. The first and second selective detection means may be controllable to vary said predetermined frequency. Preferably said first and second selective detection means comprise a tuned resonant cavity. The predetermined frequency may lie within said predetermined frequency range. Input means may be arranged to receive a supplied signal for controlling said first and second selective detection means.

The combination means may further comprise phase variation means for varying the phase of said error signal relative to the phase of said amplified signals. The phase variation means may be arranged to control said relative phase in dependence on the relative phase difference between said control signal in said amplified signals and said control signal in said error signal. The phase variation means may comprises third selective detection means being selective to a predetermined frequency for detecting said control signal in said amplified signals, and fourth selective detection means, being selective to said predetermined frequency for detecting said control signal in said error signal.

The third and fourth selective detection means may be controllable to select said predetermined frequency. The third and fourth selective detection means may each comprise a tuned cavity. The predetermined frequency may lies within said predetermined frequency range. Input means may arranged to receive a supplied signal for controlling said third and fourth selective detection means.

Preferably, said phase shift means is arranged to combine said input signals and said amplified signals to produce said error signal. The error signal may represent a weighted difference between said input signals and said amplified signals. The phase shift means may further comprise attenuation means or amplification means for weighting said input signals and/or said amplified signals before said combination. The phase shift means may further comprise delay means for introducing a fixed relative delay between said input signals and said amplified signals before said combination. The phase shift means may further comprises a hybrid for receiving said input signals and introducing a fixed phase shift to said input signals.

Preferably, said phase shift means further comprises a directional coupler connected at the output of said amplifier, wherein said directional coupler couples said error signal to said amplified signals to produce said compensated output signals. The phase shift means may comprise a hybrid for combining said input signals and said amplified signals after the introduction of said relative phase shift. The phase shift means may comprise a phase trimmer which introduces at least part of said relative phase shift, said phase trimmer receiving a control input from said control means. The control means and phase shift means preferably form a feedback loop.

Preferably, said control means further comprises a phase locked loop circuitry. Preferably, attenuation or amplification means are provided for attenuating or amplifying said error signal. The phase variation means and error signal may form a feedback loop. The phase variation means may further comprise phase locked loop circuitry.

Preferably, a base station in a cellular radio network comprises a circuit as described hereinbefore, wherein said output signals including said control signal are transmitted by the base station. The control signal thus fulfils a purpose other than just a pilot tone function.

If the base station is operating in accordance with the GSM standard, the control signal may be transmitted in the broadcast control channel (BCCH). The control signal in said output signals is continuously transmitted and/or has a constant power level and/or is used to identify a base station.

According to a second aspect of the present invention, there is provided a method of amplifying radio frequency signals for transmission, comprising the steps of: receiving a plurality of input signals including a control signal within a predetermined frequency range; amplifying said input signals to produce a plurality of amplified signals including said control signal within said predetermined frequency range; compensating said plurality of amplified signals to remove noise introduced by said amplification step, to produce a plurality of compensated amplified signals, including said control signal, within said predetermined frequency range; and transmitting said compensated amplified signals including said control signal wherein said compensation step comprises: detecting the input signals and the amplified signals; introducing a phase shift between the detected input signals and the detected amplified signals to produce an error signal; and combining said error signal with said amplified signals to produce said compensated output signals.

BRIEF DESCRIPTION OF THE DRAWINGS

For a better understanding of the present invention and to understand how the invention may be brought into effect, reference will now be made to the accompanying figures in which:

As previously described, a receiving terminal in a cellular communication network will be serviced by a particular base station depending upon its location. Each cell uses at any one time different communication channels to the cells neighbouring it. This prevents interference. As a transceiver terminal moves from cell to cell it needs to be aware of what cell it is in, that is what base station it should be communicating with and what communication channel it should be using. Once a channel has been established between the transceiver terminal and the base station data such as speech or other information to be communicated can be transmitted between the transceiver terminal and the base station on the established communication channel. There are therefore typically some control signals transmitted from the base station for reception by the transceiver terminals which allows the transceiver terminal to identify the closest base station and the channel it should communicate in. According to the Global System for Mobile communications (GSM) standard a dedicated channel, called the Broadcast Control Channel (BCCH) is used by base stations to communicate to transceiver terminals. The BCCH is used to control the channel on which the base station communicates to the transceiver terminal and the transceiver terminal communicates to the base station by assigning transmission frequencies and time slots. The BCCH also identifies the base station to the transceiver terminal. Referring to FIG. 1, the BCCH is a component of the input signal 11 and a component of the compensated amplified signal 37. It is a signal which will be transmitted and no filtering is required to remove it from the compensated amplified signal 37. The BCCH signal is continuously transmitted on all time slots and without variation of RF level.

Figure 1:
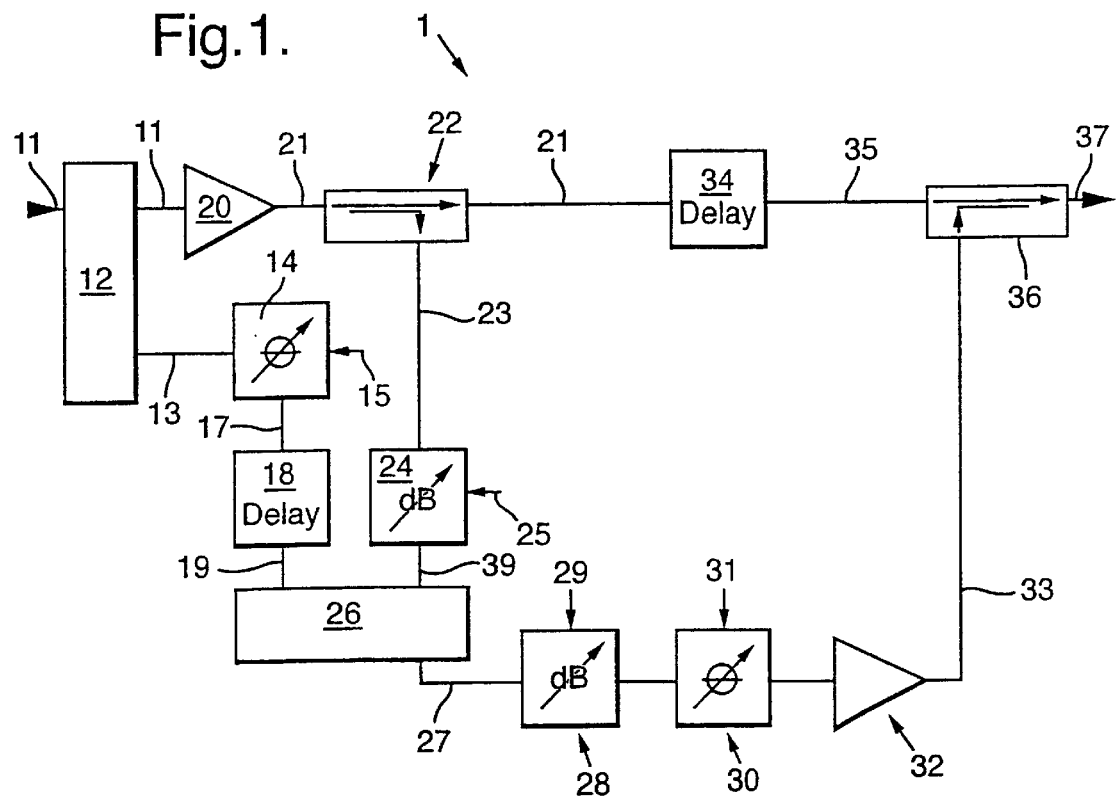
FIG. 1 illustrates a feed-forward amplification circuit.

It has been realised by the inventor that it would be particularly advantageous to use a component of the input signal 11 itself, in FIG. 1, as a pilot tone. This would remove the need for a separate synthesiser to produce a pilot tone, would remove the requirement of a separate filter to filter the pilot tone from the compensated amplified signal 37 and would mean that the pilot tone lies within the operational range of the amplifier and within the band of frequencies at which a receiver containing the amplification circuitry 1 would transmit signals. In a transmitter embodying the present invention which operates in accordance with the GSM standard, the BCCH signal may be used as a pilot tone.

Figure 3A:
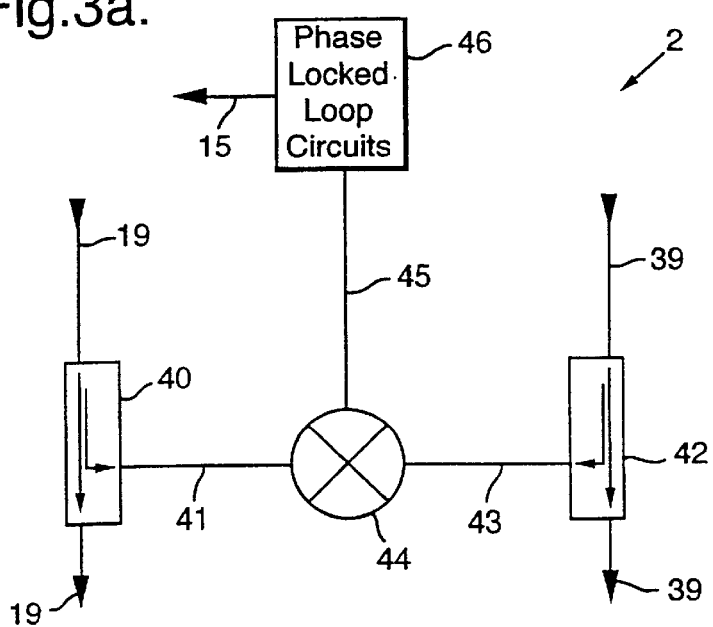
FIG. 3a illustrates a prior apparatus for supplying a first phase control signal 15.
Figure 2A:
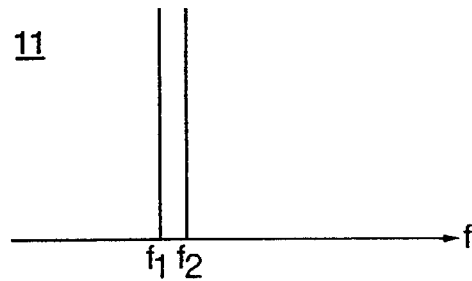
FIGS. 2a to 2d illustrate the frequency spectrums of some of the signals illustrated in FIG. 1 when an exemplary input signal 11 is supplied to the amplification circuit.
Figure 2B:
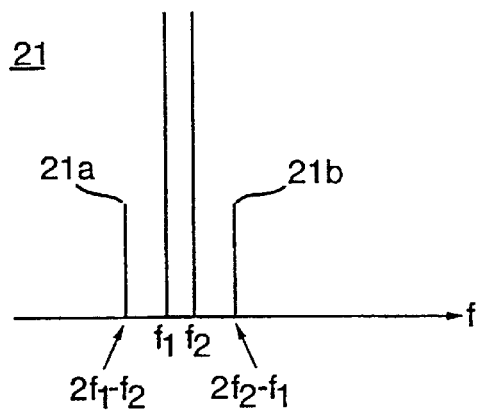
Figure 2C:
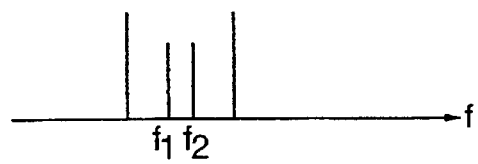
Figure 2D:
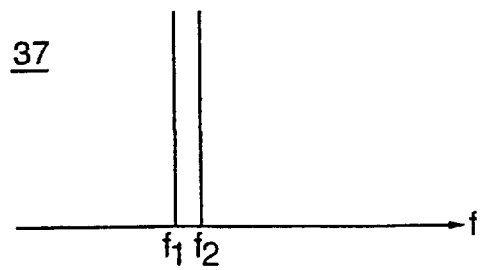
Figure 3B:
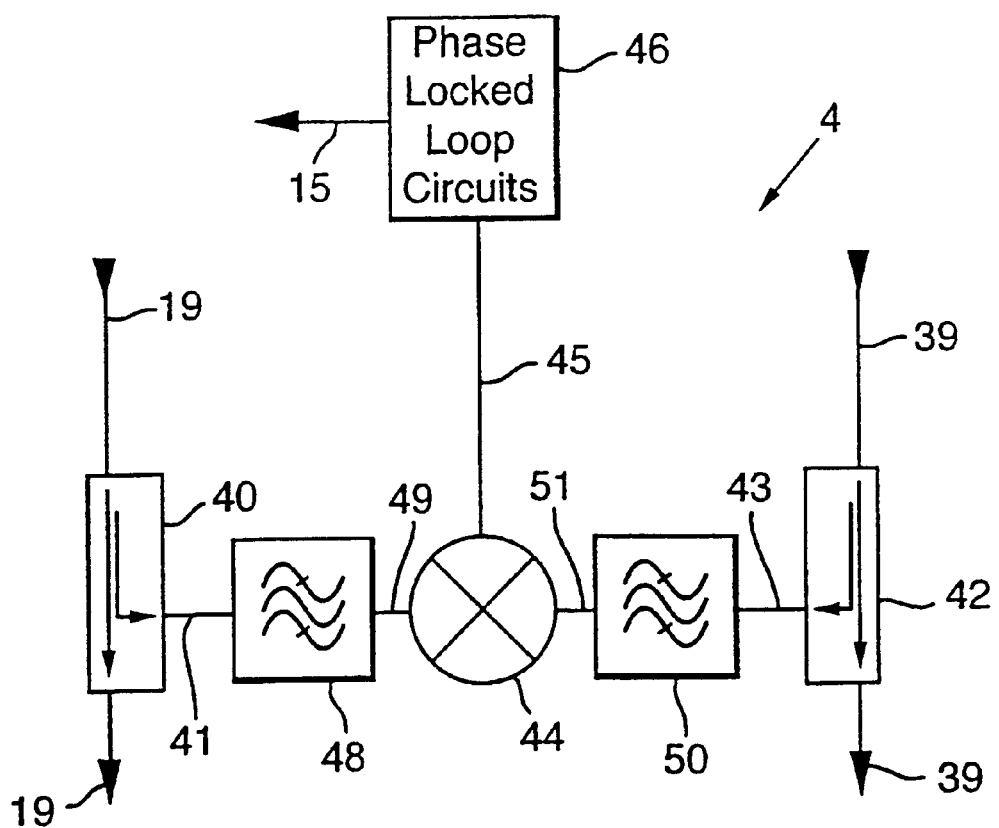
FIG. 3b illustrates a prior apparatus for supplying a first phase control signal 15, when an out of band pilot tone is used.
Figure 4:
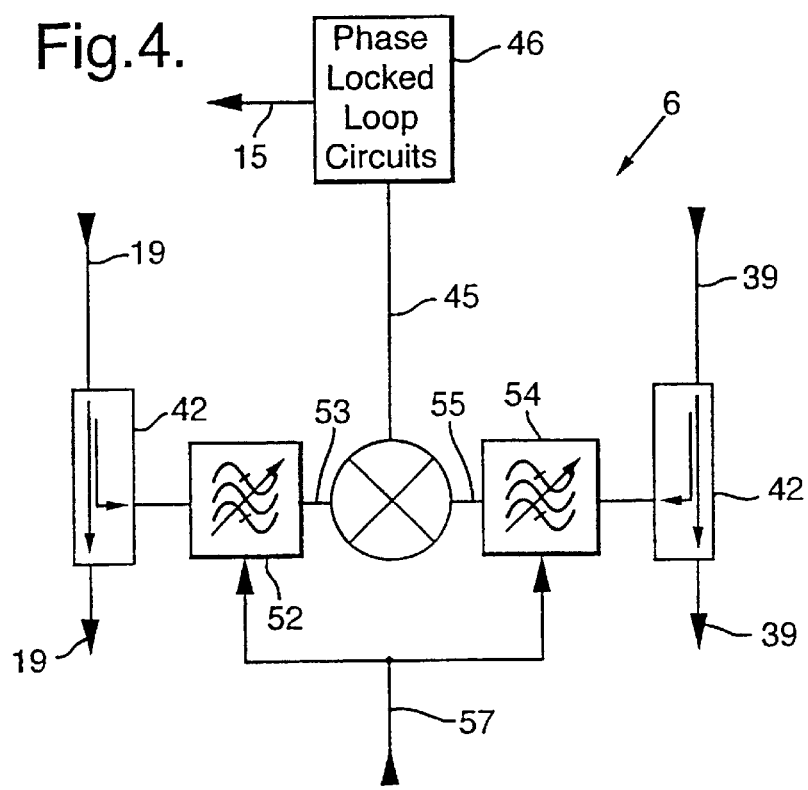
FIG. 4 illustrates a preferred apparatus, according to the present invention, for supplying a first phase control signal 15 when an in-band pilot tone is used.

Circuitry suitable for use as feed-forward amplification circuitry is illustrated in FIG. 1. The circuitry for supplying the first phase control signal 15 is illustrated in FIG. 4. Where the numerals in FIG. 4 correspond to those in FIG. 3b they designate the same signal or components. FIG. 4 illustrates a phase control circuit 6 which differs from the second phase control circuit 4 in FIG. 3b in that the first band pass filter 48 and the second band pass filter 50 in FIG. 3b are respectively replaced by a first variable filter 52 and a second variable filter 54.

The first variable filter 52 and the second variable filter 54 respectively receive the second detected signal 41 and the third detected signal 43 and produce respectively a first filtered signal 53 and a second filtered signal 55. The first variable filter 52 and the second variable filter 54 allow the pilot tone which in this case forms part of the input signal 11 to pass through them to produce the first and second filtered signals respectively. The first and second filtered signals 53 and, 55 are supplied to the mixer 44 to produce the mixed signal 45. The first and second variable filters 52 and 54 are narrow band pass filters which allow a selected frequency band to pass through them. The selected frequency band is controlled by filter control signal 57 which is input to the first and second variable filters. This signal typically is supplied from the controlling circuitry of the base station. In a GSM base station the filter control signal 57 will identify the frequency of the BCCH. The traffic channel will have a different frequency to the BCCH and will therefore be removed by the first and second variable filters 52 and 54.

The first variable filter and second variable filter may be tuned cavities. The base control circuitry 6 produces a first phase control signal 15 which forms part of a feedback loop within the feed-forward amplifier circuitry 1 as previously described in relation to FIG. 3a.

The compensation loop which effects the cancellation of the distortions introduced by the power amplifier 20 at combiner 36 has two separate paths. The first path passes through the cancellation loop which itself has two paths and then through the second variable attenuator 28, second phase trimmer 30, the amplifier 32 and the combiner 36. The second path passes through the first hybrid 12, the power amplifier 20, the detector 22, delay circuitry 34 and the combiner 36. If cancellation is to occur correctly at the combiner 36 the electrical length of the first and second paths of the compensation loop should be the same. The second phase trimmer 30 under the control of the second phase control signal 31 ensures that the two electrical lengths of the two paths in the compensation loop are the same except for 180° of phase shift to cause cancellation. Changes to the electrical length of any component in either path would disturb this condition and is compensated for by the second phase control signal 31.

Figure 5:
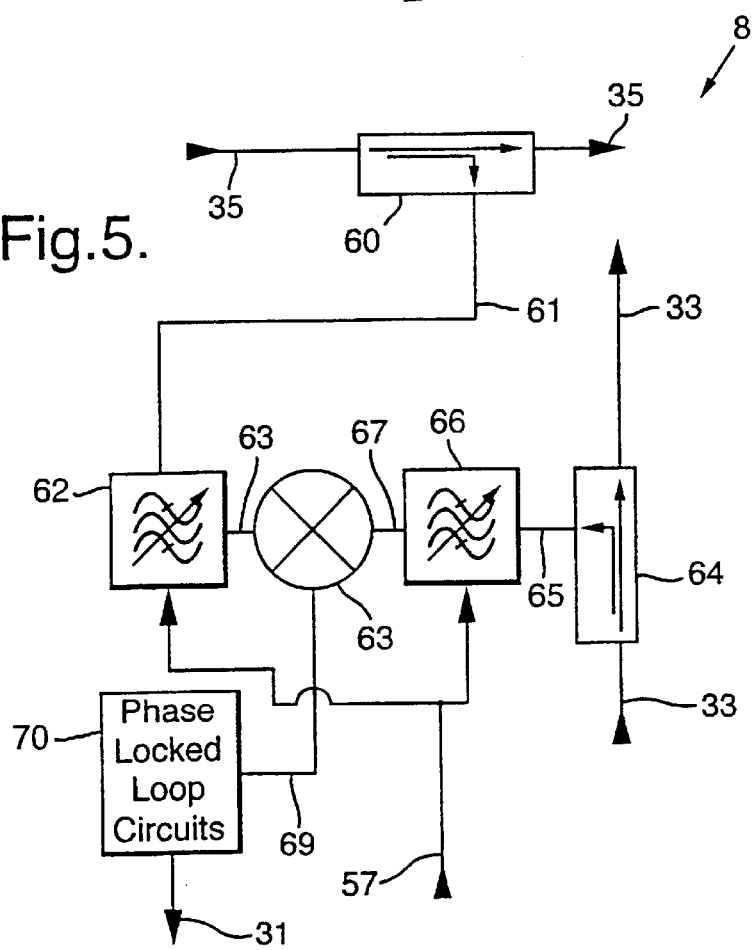
FIG. 5 illustrates an apparatus for supplying a second phase control signal 31 when an in-band pilot tone is used.

Referring to FIG. 5, a control circuit 8 for providing the second phase control signal 31 is illustrated. The control circuitry 8 has a directional coupler 60 functioning as a fourth detector, a third variable filter 62, a directional coupler 64 functioning as a fifth detector, a fourth variable filter 66, a second mixer 68 and a second phase locked loop (PLL) The third variable filter 62 and the fourth variable filter 66 are similar to the first variable filter 52 and second variable filter 54 illustrated in FIG. 4 and described with relation to that figure. The third variable filter and the fourth variable filter each receive the filter control signal 57 which determines the frequency which each of the third and fourth variable filters will allow to pass through them.

The fourth detector 60 detects the delayed amplified signal 35 to produce a detected delayed amplified signal 61 which is input to the third variable filter. The third variable filter allows a narrow frequency band of signals to pass through it to produce the third filter signal 63. The third filter signal 63 comprises the pilot tone which in a GSM implementation is at the BCCH frequency. The fifth detector 64 detects the compensated error signal 33 and produces a detected compensated error signal 65 which is supplied to the fourth variable filter 66. The fourth variable filter produces the fifth filter signal 67 which has a narrow frequency range including the frequency of the pilot tone which in a GSM implementation is the BCCH frequency. The third and fourth filter signals 63 and 67 are supplied as inputs to the second mixer 68 which produces the second mixed signal 69 which is input to the second phase locked loop 70. The second phase locked loop 70 produces the second phase control signal 31.

Referring to FIG. 1 the second phase control signal 31 controls the compensated error signal 33. Consequently, the control circuitry 8, the second phase trimmer 30 and the compensated error signal 33 combine to form a feedback circuit which maintains the electrical lengths of the first and second paths of the compensation loop in the correct relationship, i.e. 180° out of phase, so that on the combination of the compensated error signal 33 and the delayed amplified signal 35 a compensated amplified signal 37 is produced which is substantially free of distortions introduced by the amplifier 20. It should be appreciated that the contribution to the compensated error signal 33 by the pilot tone is substantially less than the contribution of the pilot tone to the delayed amplified signal 35. Consequently, the fourth filtered signal 67 will generally have a much smaller amplitude than the third filtered signal 63 and the characteristics of the mixer 68 will have to be carefully selected so that the second mixed signal 69 has suitable characteristics for achieving locking of the second phase locked loop 70.

The compensated amplified signal 37 is fed to an antenna where it is transmitted to a mobile station. The transmitted signal will include the control signal defined by the BCCH.

Embodiments of the present invention may be incorporated in mobile terminals.

Whilst the embodiment of the present invention has been described in the context of a GSM system, embodiments of the invention are applicable to any other suitable frequency division multiple access system where two channels at different frequency are transmitted at the same time and one of those channels is at a single frequency.

Embodiments of the invention have been described in the context of a transceiver. It should however be appreciated that the embodiments of the present invention have much broader application and can be used in any other suitable context where feed forward amplification is required.

What is claimed is:

1. A feed-forward amplification circuit for producing the compensated output signals of a base transceiver station (BTS) in a cellular radio network, said amplification circuit comprising:
   an amplifier arranged to receive an input signal including a control signal, within a predetermined frequency range, and to produce an amplified signal including said control signal, within said predetermined frequency range, wherein said predetermined frequency range lies within the operational range of the amplifier;
   phase shift means arranged to receive said input signal and said amplified signal and to introduce a relative phase shift between said input signal and said amplified signal to produce an error signal;
   control means for controlling said phase shift means in dependence on the relative phase difference between the control signal in said input signal and the control signal in said amplified signal; and
   combination means for combining said error signal with said amplified signals to produce said compensated output signal; wherein said control signal comprises a signal used for communication between the BTS and a transceiver terminal of the network,
   wherein said control means comprise a first selective detection means being selective to a predetermined frequency for detecting the control signal in said input signal, and a second selective detection means being selective to said predetermined frequency, for detecting the control signal in said amplified signal.

2. A circuit as claimed in claim 1, wherein said first and second selective detection means are controllable to vary said predetermined frequency.

3. A circuit as claimed in claim 1, wherein said first and second selective detection means comprise a tuned resonant cavity.

4. A circuit as claimed in claim 1, wherein said predetermined frequency lies within said predetermined frequency range.

5. A circuit as claimed in claim 4, further comprising input means arranged to receive a supplied signal for controlling said first and second selective detection means.

6. A circuit as claimed in claim 1, wherein said combination means further comprises phase variation means for varying the phase of said error signal relative to the phase of said amplified signals.

7. A circuit as claimed in claim 6, wherein said phase variation means is arranged to control said relative phase in dependence on the relative phase difference between said control signal in said amplified signal and said control signal in said error signal.

8. A circuit as claimed in claim 7, wherein said phase variation means comprises third selective detection means being selective to a predetermined frequency for detecting said control signal in said amplified signal and fourth selective detection means, being selective to said predetermined frequency for detecting said control signal in said error signal.

9. A circuit as claimed in claim 8, wherein said third and fourth selective detection means are controllable to select said predetermined frequency.

10. A circuit as claimed in claim 8, wherein said third and fourth selective detection means each comprise a tuned cavity.

11. A circuit as claimed in claim 8, wherein said predetermined frequency lies within said predetermined frequency range.

12. A circuit as claimed in claim 11, further comprising input means arranged to receive a supplied signal for controlling said third and fourth selective detection means.

13. A circuit as claimed in claim 1, wherein said phase shift means is arranged to combine said input signal and said amplified signal to produce said error signal.

14. A circuit as claimed in claim 13, wherein said error signal represents a weighted difference between said input signal and said amplified signal.

15. A circuit as claimed in claim 13, wherein said phase shift means further comprises attenuation means or amplification means for weighting said input signals and/or said amplified signal before said combination.

16. A circuit as claimed in claim 13, wherein said phase shift means further comprises delay means for introducing a fixed relative delay between said input signal and said amplified signal before said combination.

17. A circuit as claimed in claim 13, wherein said phase shift means further comprises a hybrid for receiving said input signal and introducing a fixed phase shift to said input signal.

18. A circuit as claimed in claim 1, wherein said phase shift means further comprises a directional coupler connected at the output of said amplifier, wherein said directional coupler couples said error signal to said amplified signal to produce said compensated output signals.

19. A circuit as claimed in claim 13, wherein said phase shift means comprises a hybrid for combining said input signal and said amplified signal after the introduction of said relative phase shift.

20. A circuit as claimed in claim 13, wherein said phase shift means comprises a phase trimmer which introduces at least part of said relative phase shift, said phase trimmer receiving a control input from said control means.

21. A circuit as claimed in claim 1, wherein said control means and phase shift means form a feedback loop.

22. A circuit as claimed in claim 1, wherein said control means further comprises a phase locked loop circuitry.

23. A circuit as claimed in claim 1, wherein attenuation or amplification means are provided for attenuating or amplifying said error signal.

24. A circuit as claimed in claim 6, wherein said phase variation means and error signal form a feedback loop.

25. A circuit as claimed in claim 6, wherein said phase variation means further comprises phase locked loop circuitry.

26. A base station as claimed in claim 1, wherein said output signals including said control signal are transmitted by the base station.

27. A base station as claimed in claim 26, operating in accordance with the GSM standard, wherein said control signal is transmitted in the broadcast control channel (BCCH).

28. A base station as claimed in claim 26, comprising circuitry for controlling said first and second selective detection means and/or said third and fourth selective detection means.

29. A cellular network comprising a plurality of base stations as claimed in claim 26, and a plurality of receiving terminals, wherein said control signal in said output control signals is continuously transmitted and/or has a constant power level and/or is used to identify a base station.

30. A transceiver incorporating a circuit as claimed in claim 1.

31. A method of amplifying radio frequency signals to produce compensated output signals for transmission from a base transceiver station (BTS) in a cellular radio network, comprising the steps of:

receiving an input signal within a predetermined frequency range including a control signal which comprises a signal used for communication between the BTS and a transceiver terminal of the network;

amplifying said input signal to produce an amplified signal including said control within said predetermined frequency range;

compensating said amplified signal to remove noise introduced by said amplification step, to produce a compensated amplified signal, including said control signal, within said predetermined frequency range;

said compensation step further comprising:

transmitting said compensated amplified signal including said control signal;

detecting the input signal and the amplified signal;

controlling the relative phase difference between the control signal in said input signal and the control signal in the amplified signal by introducing a phase between the detected input signal and the detected amplified signal to produce an error signal; and combining said error signal with said amplified signal to produce said compensated output signal, said controlling step further comprising detecting the control signal in said input signal according to a predetermined frequency, and detecting the control signal in said amplified signal according to said predetermined frequency.

32. The method of claim 31, wherein said compensating step further comprises the introduction of a power variation between said detected input and amplified signal before the production of said error signal.

33. The method of claim 31, wherein said step of detecting the phase difference between the control signal in the detected input signal and control signal in the detected amplified signal and the step of introducing a phase difference between said detected input signal and the detected amplified signal form steps in a feedback loop wherein the detection of the phase difference between the control signal in the detected input signal and the control signal in the detected amplified signal occurs after the phase difference has been introduced between.

34. The method of claim 31, wherein said step of introducing a phase difference between the detected input signal and the detected amplified signal to produce said error signal comprises the steps of introducing a phase difference into either one of the detected input signal or the detected amplified signal and then combining the signals to produce said error signal, wherein said phase variation is controlled so that in said error signal the control signal in said detected input signal and the control signal in said detected amplified signal substantially cancel.

35. The method of claim 31, wherein said step of combining the error signal with said amplified signal comprises the step of attenuation or amplification.

36. The method of claim 31, wherein the step of combining the error signal with said amplified signal further comprises the step of introducing a phase variation into said error signal with respect to said amplified signal.

37. The method of claim 31, wherein the step of introducing a phase variation into said error signal with respect to said output signal forms part of a feed-back loop comprising the detection of the phase difference between said amplified signal and said error signal after the introduction of said phase variation between said error signal and said amplified signal.

* * * * *